(12) United States Patent
Swaminathan et al.

(10) Patent No.: US 9,006,887 B2
(45) Date of Patent: Apr. 14, 2015

(54) FORMING SACRIFICIAL COMPOSITE MATERIALS FOR PACKAGE-ON-PACKAGE ARCHITECTURES AND STRUCTURES FORMED THEREBY

(75) Inventors: Rajasekaran Swaminathan, Tempe, AZ (US); Leonel Arana, Phoenix, AZ (US); Yoshihiro Tomita, Ibaraki-ken (JP); Yosuke Kanaoka, Ibaraki (JP)

(73) Assignee: Intel Corporation, Santa Clara, CA (US)

( * ) Notice: Subject to any disclaimer, the term of this patent is extended or adjusted under 35 U.S.C. 154(b) by 270 days.

(21) Appl. No.: 12/380,957

(22) Filed: Mar. 4, 2009

(65) Prior Publication Data
US 2010/0224993 A1 Sep. 9, 2010

(51) Int. Cl.
*H01L 23/498* (2006.01)
*H01L 21/48* (2006.01)
*H01L 25/10* (2006.01)
*H05K 3/34* (2006.01)
*H01L 21/768* (2006.01)

(52) U.S. Cl.
CPC ...... *H01L 23/49816* (2013.01); *H01L 21/4853* (2013.01); *H01L 23/49894* (2013.01); *H01L 25/105* (2013.01); *H05K 3/3484* (2013.01); *H01L 2224/16225* (2013.01); *H05K 3/3452* (2013.01); *H05K 2203/043* (2013.01); *H05K 2203/083* (2013.01); *H05K 2203/1476* (2013.01)

(58) Field of Classification Search
USPC ............ 257/737, E21.589, E23.068; 438/613
See application file for complete search history.

(56) References Cited

U.S. PATENT DOCUMENTS

| | | | | |
|---|---|---|---|---|
| 4,807,021 | A * | 2/1989 | Okumura | 257/777 |
| 7,226,812 | B2 | 6/2007 | Lu et al. | 438/114 |
| 7,851,894 | B1 * | 12/2010 | Scanlan | 257/659 |
| 7,971,347 | B2 | 7/2011 | Arana et al. | 29/832 |
| 2002/0195708 | A1 * | 12/2002 | Stephenson et al. | 257/738 |
| 2006/0160274 | A1 * | 7/2006 | Larson | 438/118 |
| 2007/0023203 | A1 * | 2/2007 | Leizerovich et al. | 174/255 |
| 2007/0273049 | A1 * | 11/2007 | Khan et al. | 257/787 |
| 2009/0133908 | A1 | 5/2009 | Goodner et al. | 174/255 |
| 2009/0146301 | A1 * | 6/2009 | Shimizu et al. | 257/738 |
| 2009/0320281 | A1 * | 12/2009 | Arana et al. | 29/842 |

OTHER PUBLICATIONS

Jayachandran et al., "Air Channel Fabrication for Micromechanical Systems via Sacrificial Photosensitive Polycarbonates", *Journal of Microelectromechanical Systems*, vol. 12, No. 2, Apr. 2003, pp. 147-159.

* cited by examiner

*Primary Examiner* — Zandra Smith
*Assistant Examiner* — Lawrence Tynes, Jr.
(74) *Attorney, Agent, or Firm* — Konrad Raynes Davda & Victor LLP; Alan S. Raynes

(57) ABSTRACT

Methods of forming a microelectronic packaging structure are described. Those methods may include forming a solder paste comprising a sacrificial polymer on a substrate, curing the solder paste below a reflow temperature of the solder to form a solid composite hybrid bump on the conductive pads, forming a molding compound around the solid composite hybrid bump, and reflowing the hybrid bump, wherein the sacrificial polymer is substantially decomposed.

5 Claims, 5 Drawing Sheets

FORMING SACRIFICIAL COMPOSITE MATERIALS FOR PACKAGE-ON-PACKAGE ARCHITECTURES AND STRUCTURES FORMED THEREBY

BACKGROUND OF THE INVENTION

As semiconductor technology advances for higher processor performance, advances in packaging architectures may include package-on-package (POP) architecture and other assemblies that may require exposed die-side solder bumps (for enabling of ball on ball (BoB) technologies, for example). Such packaging architectures enable solder joint formation with a top package.

BRIEF DESCRIPTION OF THE DRAWINGS

While the specification concludes with claims particularly pointing out and distinctly claiming certain embodiments of the present invention, the advantages of this invention can be more readily ascertained from the following description of the invention when read in conjunction with the accompanying drawings in which:

DETAILED DESCRIPTION OF THE PRESENT INVENTION

Figure 1A:
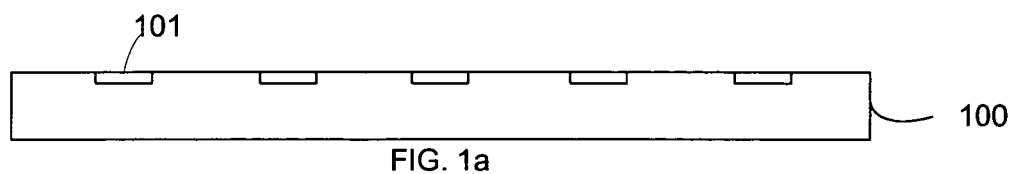
FIGS. 1a-1e represent methods of forming structures according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming and utilizing a microelectronic structure, such as a solder interconnect structure, are described. Those methods may comprise forming a solder paste comprising a sacrificial polymer on a substrate, curing the solder paste below a reflow temperature of the solder to form a solid composite hybrid bump on the conductive pads, forming a molding compound around the solid composite hybrid bump, and reflowing the hybrid bump, wherein the thermally decomposable polymer is substantially decomposed. Methods of the present invention enable the fabrication of molded package-on-package architectures such as PoP assemblies and other assemblies that require exposed die-side solder bumps to enable solder joint formation with a top package.

Figure 1B:
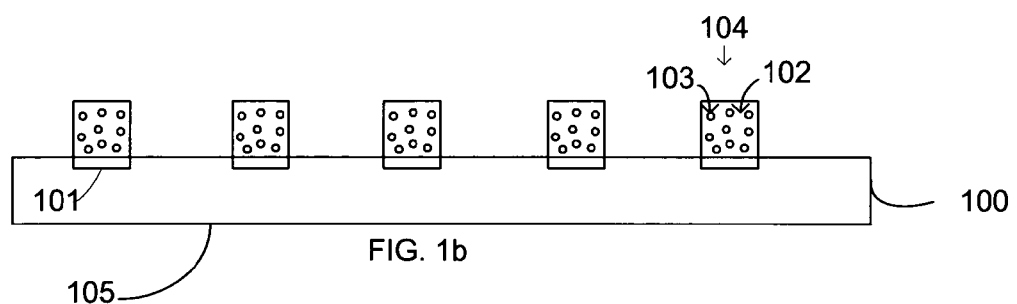

FIGS. 1a-1e illustrate embodiments of a method of forming a microelectronic structure, such as an interconnect structure, for example. FIG. 1a illustrates a substrate 100. In one embodiment, the substrate 100 may comprise at least one of a package substrate, a motherboard, an interposer, a test coupon, and a land grid array. The substrate 100 may comprise a portion of an exposed top ball over mold (ET-BOM) or an (exposed side mold) ESM packaging configuration, in some embodiments. The substrate 100 may comprise die side lands/conductive pads 101, in an embodiment. A solder paste 102 comprising a sacrificial polymer 103 may be formed on the substrate 100 (FIG. 1b). In another embodiment, the solder paste 102 comprising the sacrificial polymer 103 may be formed on a land side of the substrate 100. The solder paste 102 comprising the sacrificial polymer 103 may be formed on the substrate 100 as a plurality of hybrid bump structures 104.

The sacrificial polymer 103 may comprise a thermally decomposable polymer. In an embodiment, the sacrificial polymer may comprise a class of polymeric materials that may thermally decompose into very light molecules, leaving little to no residue behind. In an embodiment, the sacrificial polymer 103 may comprise such materials as polynorbornenes and certain polycarbonates, for example. The sacrificial polymer 103 may comprise a relatively low decomposition temperature, and in some embodiments, the decomposition temperature may be tunable for a given application.

In an embodiment, the sacrificial polymer may comprise a material with specific rheological properties (e.g. thixotropy) and decomposition temperature designed for the particular application. In an embodiment, polycarbonates may comprise a temperature range of between about (150-225 C), and may be applicable in various embodiments. In some cases, no-clean paste/flux materials may be used in electronic packaging structures utilizing the sacrificial polymer 103 so that minimal residue may be left behind during subsequent processing, such as during post chip attach processing.

The sacrificial polymer 103 may be evenly dispersed within the solder paste 102, in one embodiment. The sacrificial polymer 103—solder paste 102 composite may be printed on the die side lands 101 of the substrate in an embodiment, and/or may be formed onto solder prior to a molding process to be described subsequently herein. In an embodiment, the solder paste 102 comprising the sacrificial material 103 may be dispensed as a paste/liquid.

Figure 1C:
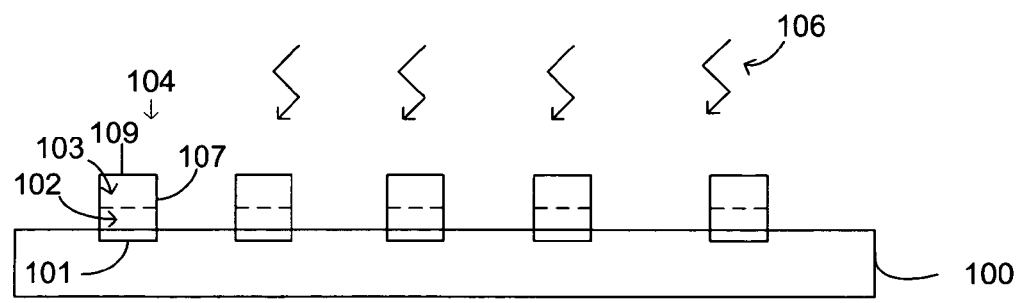

In an embodiment, the sacrificial polymer 103 within the hybrid bump structures 104 may be cured 106 using heat and/or UV to form a solid composite (FIG. 1c). In some cases the sacrificial polymer 103 of the hybrid bump 104 may not need to be cured. The cure temperature of the sacrificial polymer 102 may be below a reflow temperature of the solder paste 102, in an embodiment. In an embodiment, the curing of the sacrificial polymer 103 in the solder paste 102 may form a solid composite on the conductive pads 101 of the substrate 100. At this point the solder paste 102 may not be reflowed, nor is the sacrificial material 103 decomposed.

In this manner, hybrid bump structures 104 with near vertical sidewalls 107 can be formed. In an embodiment, the solder paste 102 and sacrificial polymer 103 can be designed to phase separate, such that the lower density sacrificial material 103 may rise to a surface 109 of the hybrid bump structures 104, or alternatively, the solder paste/sacrificial polymer hybrid bump structure 104 can be designed to maintain good dispersion of the sacrificial polymer 103 throughout the hybrid bump structure 104.

Figure 1D:
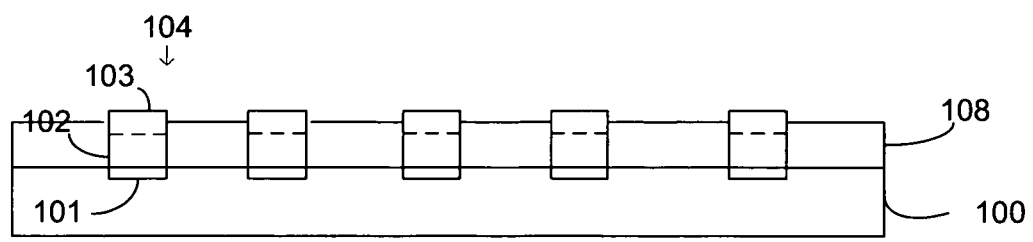

Next, a molding compound 108 may be formed around the hybrid bump structures 104 on the surrounding substrate 100 (FIG. 1d). In an embodiment, the molding compound may be formed by using either transfer or compression molding processes. In an embodiment, the hybrid bump structures 104 can be left exposed, wherein the hybrid bump structures 104 may comprise a height higher than that of the molding height. In another embodiment, the molding compound 108 can be formed over the hybrid bump structures, and a post-mold grinding process (not shown) may then expose the hybrid bump structures 104. In another embodiment, the molding compound used in such processes as ESM or ET-BOM packages, for example, may be eliminated, in cases wherein the solder/polymer composite material has the necessary elasticity to temporarily (elastically) deform during clamping of the mold chase and whereby the hybrid bumps may "self gasket".

Figure 1E:
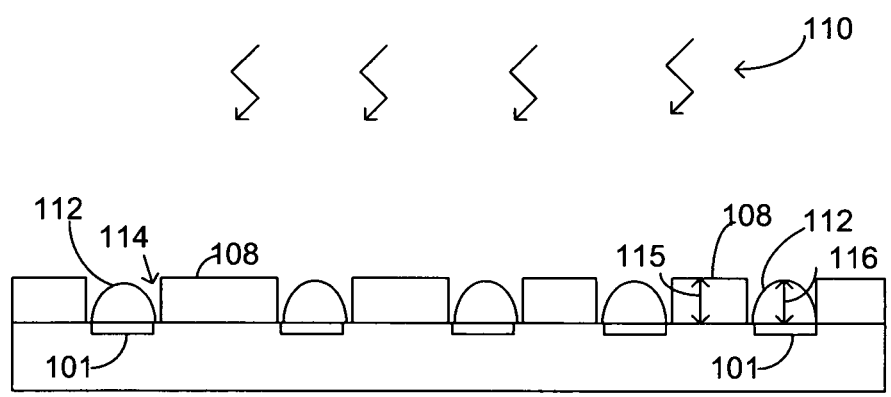

Once the hybrid bump structures 104 are exposed, the sacrificial polymer 103 may be burned off from the hybrid bump structure 104 to leave behind the solder paste on the conductive pads 101 (FIG. 1e). In an embodiment, the sacrificial polymer may be burned off during a solder reflow process 110, for example. During thermal decomposition of the sacrificial polymer, any mold flash that may have been present on the hybrid bumps 104 may be burned off. The solder paste 102 may be reflowed during the reflow process 110 to form a plurality of solder interconnect structures 112/solder bumps disposed on the conductive pads 101 (FIG. 1e).

An opening 114 may be disposed between the molding compound and individual solder interconnect structure 112. The solder interconnect structures 112 may comprise a height 116 that is about the same or lower than a height 115 of the molding compound 108 in some cases. In an embodiment, further processing may be performed such as but not limited to a wet etch and/or a plasma etch to improve the shape of the openings 114 in the mold compound 108, which may be useful for POP assembly optimization. Thus, separation between solder interconnect structures 112 and the molding compound 108 may be enhanced, and decoupling between the volume of the opening 114 and the volume of the solder may be achieved.

Figure 2A:
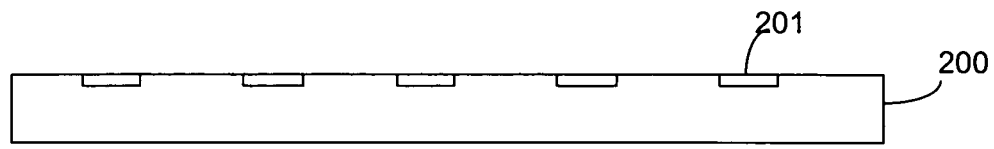
FIGS. 2a-2e represents methods of forming structures according to another embodiment of the present invention.
Figure 2B:
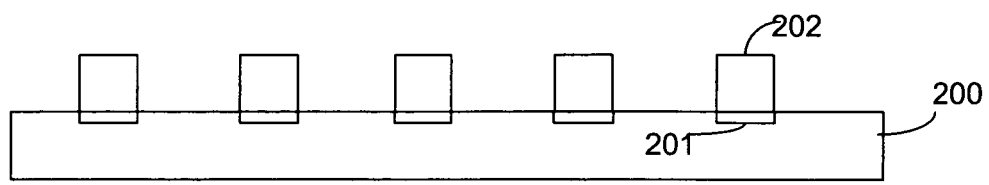
Figure 2C:
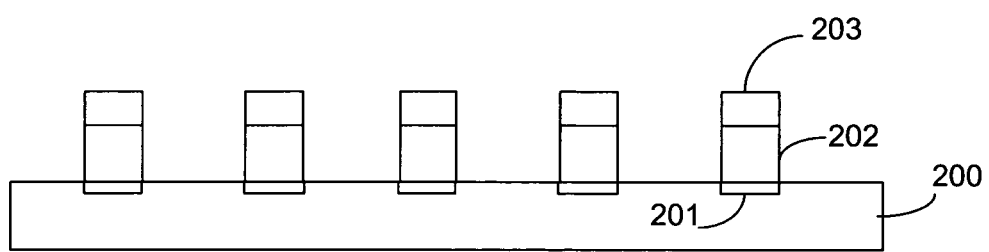
Figure 2D:
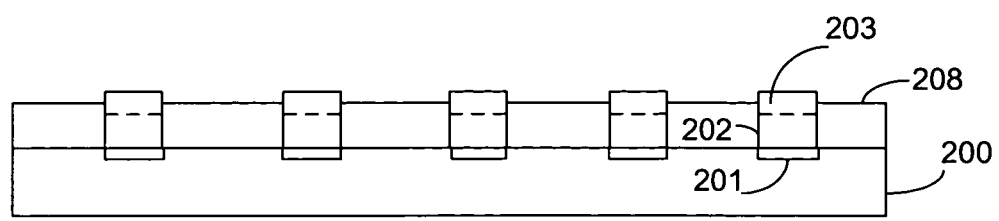
Figure 2E:
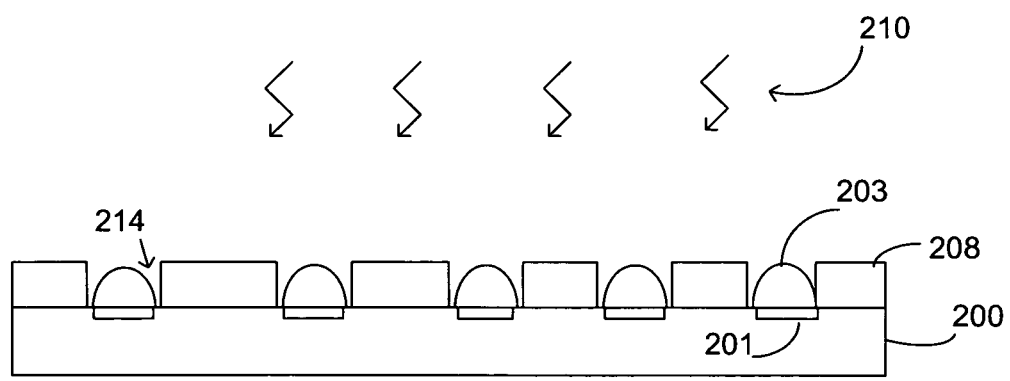

In an alternative embodiment, solder paste and sacrificial polymer may be applied sequentially, whereby a solder paste may be applied to conductive pads 201 disposed on a substrate 200 initially to form solder bumps 202 (FIGS. 2a-2b). The solder bumps 202 may be formed by using a stencil printing and reflow process, for example. A sacrificial polymer 203 (which may or may not be subsequently cured) may then be applied over the solder bumps 202 (FIG. 2c) just prior to forming a molding compound 208 on the substrate 200 surrounding the solder bumps 202 (FIG. 2d). The molding compound 208 may be formed by utilizing a jet dispense process, for example.

In an embodiment, the sacrificial polymer 203 may be burned off during a solder reflow process 210, for example. During thermal decomposition of the sacrificial polymer, any mold flash that may have been present on the solder bumps 202 may be burned off. An opening 214 may be disposed between the molding compound 208 and the solder bumps 202, and the solder bumps 202 may comprise a height that is lower than a height of the molding compound 208. This layered structure may achieve many of the same benefits achieved with the composite paste (e.g. separation between solder 202 and mold 208, and decoupling between the volume of the opening 214 and the volume of the solder).

Figure 3A:
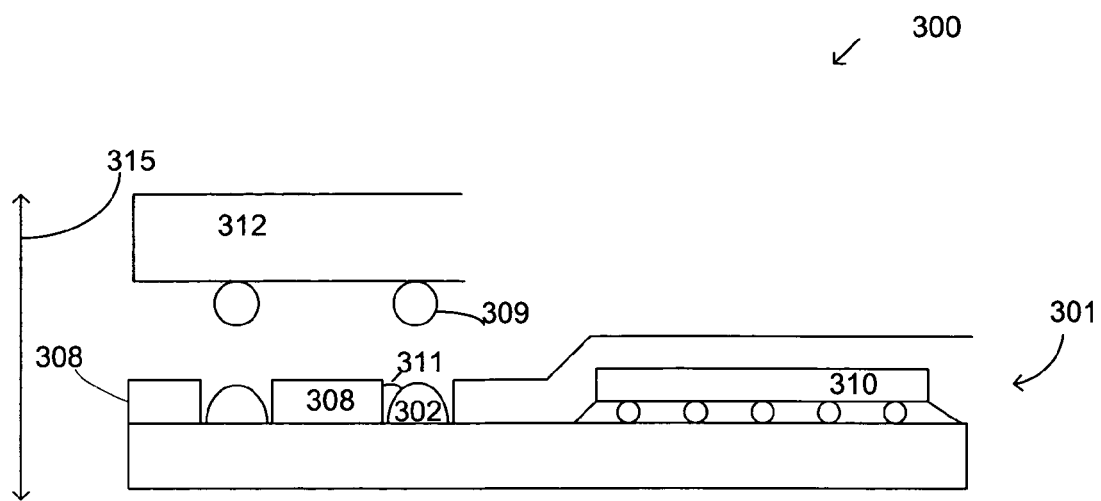
FIGS. 3a-3b represents structures according to an embodiment of the present invention.
Figure 3B:
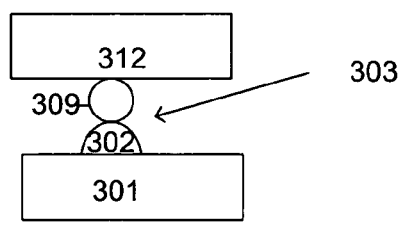

In another embodiment, a portion of a POP structure 300, which may comprise a portion of a thin die 310 exposure top ball over mold (ETBOM) package structure 300, is shown (FIG. 3a). The ETBOM package 300 may comprise solder interconnect structures 302 disposed on a bottom package portion 301 according to embodiments of the present invention. Greater process control of a side wall angle 311 between a mold compound 308 (on die side, for example) and the reflowed solder ball 302 may be enabled for reduced stress concentration in solder joints, such as a low height solder joint 303 (FIG. 3b) that may be formed between the solder interconnect structures 302 of the bottom package 301 and a solder interconnect structure 309 of a top package 312 of the POP 300. Additionally the embodiments of the present invention may provide for greater control of volume shrinkage between solder joints and between solder and mold compound/underfill materials. A lower stand off height is also possible for the PoP package 300 by having a lower height solder joint, which cannot be achieved with the standard BoB approach. In an embodiment, an opening 313 between the solder ball 302 and the mold compound 308 is capable of allowing for aligning of the low height solder joint 303 in an x-y direction.

Figure 3C:
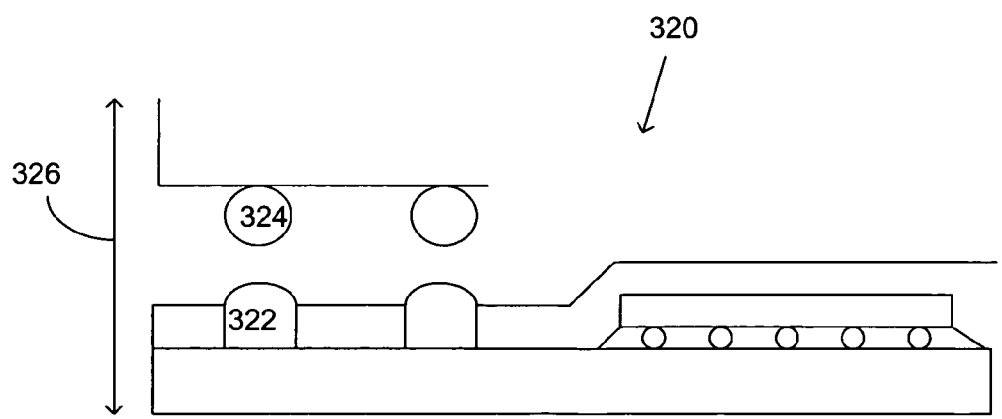
FIG. 3c represents a structure according to the Prior Art.

Since the solder interconnects 302 in the PoP 300 may be formed by using sacrificial polymer-solder composite paste (which comprise a lower height than prior art solder balls), a Z height 315 of the POP 300 may be lower than in prior art POP package structures. For example, the prior art package structure 320 shown in FIG. 3c comprises a standard BOB joint structure. Since the solder balls 322, 324 may comprise a taller height when joined than the solder interconnects of the package structure 300, a Z height for the prior art package 320 may be taller than a Z height for packages utilizing the solder interconnect structures according to the embodiments of the present invention, as in the package structure 300 of FIG. 3a, for example.

Benefits of the present invention enable the fabrication of sacrificial polymer-solder composite materials for molded package-on-package architectures. The control of side wall angle for reduced stress concentration in solder joints is possible, since the top solder in the BoB process may have more space in the opening generated by the sacrificial polymer to accommodate itself. Control of volume shrinkage between the solder joints will result in it losing contact with the mold compound sidewalls, thus creating an escape path for moisture during solder reflow (thereby preventing solder extrusion).

The various embodiments provide for the reduction or elimination of mold flash or filler on the solder structures as compared to standard ETBOM and ESM processes. This enables the elimination of a post mold cleaning step in some case. The pocket-like structure with low solder on conductive pads can potentially enhance alignment integrity of the top package for POP architecture as the side wall of the pocket structure may prohibit the movement of the structure in the x-y direction. Additionally, the embodiments of the invention can be used on the land side of the package to form the second level interconnect (BGA/SGA equivalent).

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that various microelectronic structures, such as package structures, are well known in the art. Therefore, the Figures provided herein illustrate only portions of an exemplary microelectronic device that pertains to the practice of the present invention. Thus the present invention is not limited to the structures described herein.

What is claimed is:

1. A structure comprising:
   a solder disposed on a conductive pad of a substrate;
   a polymer disposed in contact with a surface of the solder;
   a molding compound disposed on the substrate and spaced apart from the surface of the solder;
   wherein the polymer has a thermal decomposition temperature that is no greater than a reflow temperature of the solder; and
   wherein the surface of the solder is separated from the molding compound by the polymer.

2. The structure of claim 1, wherein the polymer comprises a curable polymer, and has a cure temperature that is less than a reflow temperature of the solder.

3. The structure of claim 1, wherein the polymer comprises a polynorbornene material.

4. The structure of claim 1, wherein the polymer comprises a polycarbonate material.

5. The structure of claim 1, wherein the polymer has a density that is lower than that of the solder.

* * * * *